United States Patent [19]
Ball et al.

[11] Patent Number: 5,583,373
[45] Date of Patent: Dec. 10, 1996

[54] APPARATUS FOR ACHIEVING MECHANICAL AND THERMAL ISOLATION OF PORTIONS OF INTEGRATED MONOLITHIC CIRCUITS

[75] Inventors: James V. Ball, Sunnyvale; Robert A. Pease, San Francisco, both of Calif.

[73] Assignee: National Semiconductor Corporation, Santa Clara, Calif.

[21] Appl. No.: 541,258

[22] Filed: Oct. 12, 1995

Related U.S. Application Data

[63] Continuation of Ser. No. 208,030, Mar. 7, 1994, abandoned.

[51] Int. Cl.$^6$ ............................ H01L 23/02; H01L 29/82; H01L 23/495
[52] U.S. Cl. ..................... 257/678; 257/420; 257/676; 257/704
[58] Field of Search ................................. 257/419, 676, 257/678, 679, 704, 420

[56] References Cited

U.S. PATENT DOCUMENTS

| | | | |
|---|---|---|---|
| 3,585,416 | 6/1971 | Mellen | 310/8.1 |
| 4,571,661 | 2/1986 | Hoshino | 361/283 |
| 4,672,411 | 6/1987 | Shimizu et al. | 257/419 |
| 4,696,188 | 9/1987 | Higashi | 73/204 |
| 4,706,374 | 11/1987 | Murakami | 437/225 |
| 4,772,928 | 9/1988 | Dietrich et al. | 357/26 |
| 4,774,633 | 9/1988 | Dehaine et al. | 257/679 |

(List continued on next page.)

OTHER PUBLICATIONS

Richard J. Reay, Emo. H. Klaassen, Gregory T.A. Kovacs, "TA 9.7: A Micromachined Low-Power Temperature-Regulated Bandgap Voltage Reference", ISSCC95/Session 9/Integrated Sensors and Circuits/Paper TA 9.7, *1995 IEEE International Solid-State Circuits Conference, 1995 Digest of Technical Papers*, vol. 38, ISSN 0193-6530, pp. 166-167 and 359 (1995).

Frank Goodenough, "Heated Actuator Self-Tests ±50-G Accelerometer IC", Electronic Design, Jun. 25, 1992, pp. 107-110.

Brian Link, "Field-Qualified Silicon Accelerometers: 1 Milli g to 200,000 g", Sensors, Mar. 1993, pp. 28-33.

Egbert Spiegel, M. Kandler, Y. Manoli, and W. Mokwa, "TA7.5: A CMOS Sensor and Signal Conversion Chip for Monitoring Arterial Blood Pressure and Temperature", 1992 IEEE International Solid-State Circuits Conference, ISSCC 92, Paper 7.5, pp. 126-127, & 264.

Mark Gottschalk, "Thin-Film NI-TI Alloy Powers Silicon Microvalve", Design News, Jul. 19, 1993, pp. 67-68.

Frank Goodenough, "Capacitance-Based Acceleration Sensor Combines Bulk and Surface Micromachining", Electronic Design, date unknown, pages unknown.

*Primary Examiner*—Sara W. Crane
*Assistant Examiner*—David Ostrowski
*Attorney, Agent, or Firm*—Limbach & Limbach

[57] ABSTRACT

A preferred embodiment of an integrated semiconductor device includes a semiconductor die having a hole therethrough. A paddle member includes a handle member connected between the paddle member and the semiconductor die to suspend the paddle member in the hole. A cap layer is bonded to the semiconductor die to completely cover the hole, the paddle member, and the handle member. The second surface of the semiconductor die is bonded to the lead frame. A preferred embodiment of a method of manufacturing an integrated semiconductor device includes the steps of: forming a semiconductor die having a paddle area for isolating sensitive circuitry and an unoccupied area which substantially surrounds the paddle area except for a handle area, forming a trench in the unoccupied area, covering the paddle area, the trench, and the handle area with a sacrificial spacer material, covering the sacrificial spacer material with a cap layer, etching the semiconductor die beneath the paddle area and the trench until the handle area suspends the paddle area within a hole formed in the semiconductor die, and bonding the second surface of the semiconductor die to a lead frame.

17 Claims, 6 Drawing Sheets

U.S. PATENT DOCUMENTS

| | | | |
|---|---|---|---|
| 4,849,071 | 7/1989 | Evans et al. | 257/419 |
| 4,864,383 | 9/1989 | Glotan et al. | 257/679 |
| 4,892,842 | 1/1990 | Corrie et al. | 437/67 |
| 4,910,582 | 3/1990 | Miyamoto et al. | 257/679 |
| 4,990,986 | 2/1991 | Murakami et al. | 357/26 |
| 4,996,411 | 2/1991 | Rebjock | 257/679 |
| 5,006,487 | 4/1991 | Stokes | 437/228 |
| 5,037,782 | 8/1991 | Nakamura et al. | 437/902 |
| 5,045,503 | 9/1991 | Kobiki et al. | 437/228 |
| 5,051,379 | 9/1991 | Bayer et al. | 437/225 |
| 5,059,543 | 10/1991 | Wise et al. | 437/3 |
| 5,103,279 | 4/1992 | Gutteridge | 357/25 |
| 5,115,292 | 5/1992 | Takebe et al. | 357/26 |
| 5,129,983 | 7/1992 | Greiff | 257/419 |
| 5,138,414 | 8/1992 | Shinohara | 357/26 |
| 5,155,061 | 10/1992 | O'Connor et al. | 437/86 |
| 5,202,281 | 4/1993 | Ishibashi | 437/51 |
| 5,242,863 | 9/1993 | Xiang-Zheng et al. | 257/419 |
| 5,272,374 | 12/1993 | Kodai et al. | 257/679 |
| 5,283,459 | 2/1994 | Hirano et al. | 257/419 |

APPARATUS FOR ACHIEVING MECHANICAL AND THERMAL ISOLATION OF PORTIONS OF INTEGRATED MONOLITHIC CIRCUITS

This is a continuation of application Ser. No. 08/208,030 filed on Mar. 7, 1994, now abandoned.

BACKGROUND OF THE INVENTION

1. Field of the Invention

The present invention relates to integrated circuit semiconductor device technology and, more particularly, to an apparatus and method for achieving mechanical and thermal isolation of portions of integrated monolithic circuits.

2. Description of the Related Art

Semiconductor package stress and thermal gradients tend to degrade the precision and accuracy of analog integrated circuits. For example, an operational amplifier's input and output tolerances tend to shift during package assembly due to the stress imposed on the semiconductor die. This phenomenon is known as "assembly shift". Usually, however, only a small portion of the semiconductor die has stress/thermal sensitive components. Such sensitive components include matched pairs in input stages, band-gap references, and R-2R ladders. The sensitive components can usually be collected together in one area of the die.

A few sources of package stress include the scribing and separation of the die, bonding of the die to a lead frame, stress caused by the molding compound, and lead frame twist. The stress caused by the molding compound results from the curing of the compound, internal particles in the compound pressing on the die, and aging of the compound. Lead frame twist is caused by tab cutoff and the mounting and soldering of the PC board.

A few sources of thermal gradients in the sensitive component areas of the semiconductor die include heat conduction from the rest of the die, power sources and heat sinks on the die, and external heat sources. Heat generated by external heat sources is transferred to the die through the molding compound and through leads.

Previous methods of reducing package-induced stress effects have focused on reducing the stress that is transferred to the entire semiconductor die by the package leadframe, die bonding material, and molding compound. These methods, however, have not been fully effective, partly because they attempt to protect the entire die when only a small portion of the die actually requires stress/thermal protection.

The semiconductor device microstructure disclosed in U.S. Pat. No. 4,696,188 to Higashi attempts to provide an environment of substantial physical and thermal isolation between an electric element and a semiconductor body. However, the Higashi device suffers from the disadvantage that the electric element is not contained in a totally sealed environment.

Thus, there is a need for an apparatus and method for reducing the stress and thermal gradients transferred to the sensitive components of a semiconductor die that overcomes the disadvantages of the methods described above.

SUMMARY OF THE INVENTION

The present invention provides an integrated semiconductor device. A semiconductor die having a first surface, a second surface, and a thickness, has an opening formed in the first surface. A paddle member for isolating portions of circuitry from mechanical stress and thermal gradients has a first surface, a second surface, and a thickness that is less than the thickness of the semiconductor die. A handle member is connected between the paddle member and the semiconductor die to suspend the paddle member in the opening. A cap layer is bonded to the first surface of the semiconductor die to completely cover the opening, the paddle member, and the handle member. The cap layer is spaced apart from the paddle member.

The present invention also provides a method of manufacturing an integrated semiconductor device. The method includes the following steps. A semiconductor die having a first surface, a second surface, and a thickness is formed. The first surface includes a paddle area for receiving and isolating sensitive circuitry and an unoccupied area which substantially surrounds the paddle area, except for a handle area. The handle area provides a path for making electrical connection between the paddle area and the rest of the first surface of the semiconductor die. A trench is formed in the unoccupied area. The trench has a depth that is less than the thickness of the semiconductor die. A cap layer is formed over the paddle area, the trench, and the handle area. The cap layer is spaced apart from the paddle area. The second surface of the semiconductor die beneath the paddle area and the trench is etched until the handle area suspends the paddle area within a hole formed in the semiconductor die.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENTS

In general, only a small portion of a precision analog semiconductor die will need or benefit from a stress-free environment. For example, the ratioed transistors and current source that generate the constant voltage in a band-gap reference are quite stress sensitive, but the buffer amplifiers are much less sensitive. Precision of a system die can be enhanced by isolating only the sensitive components in the die from mechanical stress and thermal gradients. The present invention provides an apparatus and method for isolating just those elements that need isolation within the framework of the larger die.

Figure 1:
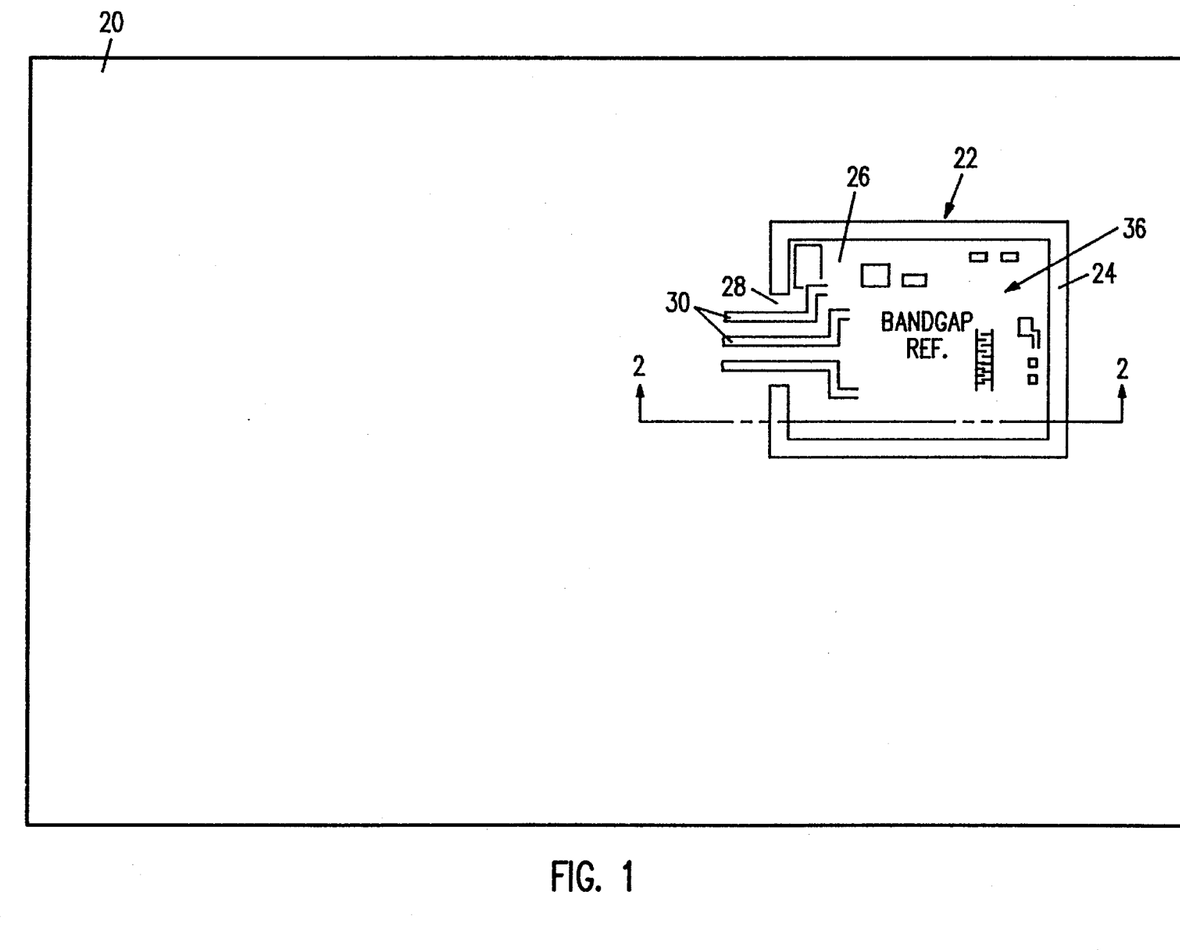
FIG. 1 is a top plan view illustrating a semiconductor die having an isolation area formed therein in accordance with the present invention.

FIG. 1 illustrates an integrated semiconductor die 20 in accordance with the present invention. An isolation area 22 is isolated from the main die 20 and, in effect, is packaged within the die 20 in a relatively stress-free and thermal-free environment. Sensitive circuitry, such as a band-gap reference, may be mounted in the isolation area 22. By using the teachings of the present invention, low cost packaging techniques, such as molded plastic encapsulation, can be used even for very high precision integrated circuits.

The isolation area includes a hole 24 (or "opening" 24) that preferably extends completely through the semiconductor die 20. Although the hole 24 shown in the figures extends completely through the semiconductor die 20, it is envisioned that the hole 24 may extend only partially through the semiconductor die 20. The term "opening" 24 as used herein is intended to cover both a hole 24 which extends completely or only partially through the semiconductor die 20.

A paddle member 26 is positioned in the hole 24. The paddle member 26 includes a handle member 28 which connects the paddle member 26 to the die 20. The handle member 28 suspends the paddle member 26 in the hole 24. The paddle member 26 does not make contact with the die 20, except at the handle member 28; preferably, the paddle member 26 is substantially centered in the hole 24.

The hole 24 and paddle member 26 are preferably rectangular in shape with the paddle member 26 having a smaller surface area than the area of the hole 24; however, it should be well understood that the hole 24 and the paddle member 26 may be a variety of different shapes such as square, circular, triangular, octagonal, etc. The main criteria is that the sides of the paddle member 26 do not make contact with the sides of the hole 24, except at the handle member 28.

The stress/temperature sensitive circuitry is mounted on the paddle member 26 in the isolation area 22. The handle member 28 provides a path for making electrical connection between the circuitry on the paddle member 26 in the isolation area 22 and the rest of the semiconductor die 20. Specifically, electrical connection to the circuit elements on the paddle member 26 is made via the metal lines 30 running across the handle member 28 to the main part of the die 20.

Figure 2:
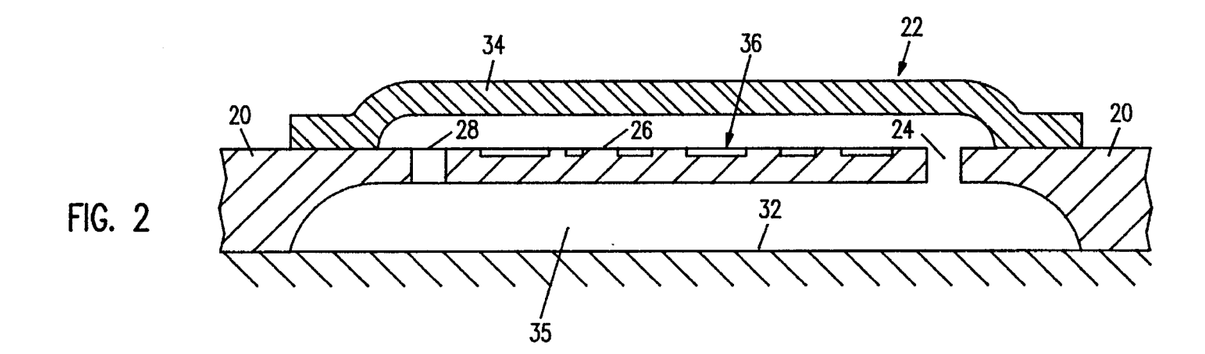
FIGS. 2, 3, 4, 5, 6, and 7 are modified and enlarged cross-sectional views taken along line 2—2 of FIG. 1 which illustrate a method of forming the isolation area shown in FIG. 1 in accordance with the present invention.

Referring to FIG. 2, the paddle member 26 and the handle member 28 are positioned so that their upper surfaces are substantially parallel with the upper surface of the die 20 so that circuitry mounted on the paddle member 26 and the die 20 faces directly upward and is not mounted on planes that are at angles with one another. As will be evident from the discussion of the method below, the upper surfaces of the paddle member 26 and the handle member 28 will also normally be substantially flush with the upper surface of the die 20; however, the surfaces are not required to be flush with one another. The lower surface of the die 20 is preferably bonded to a lead frame 32.

Figure 10:
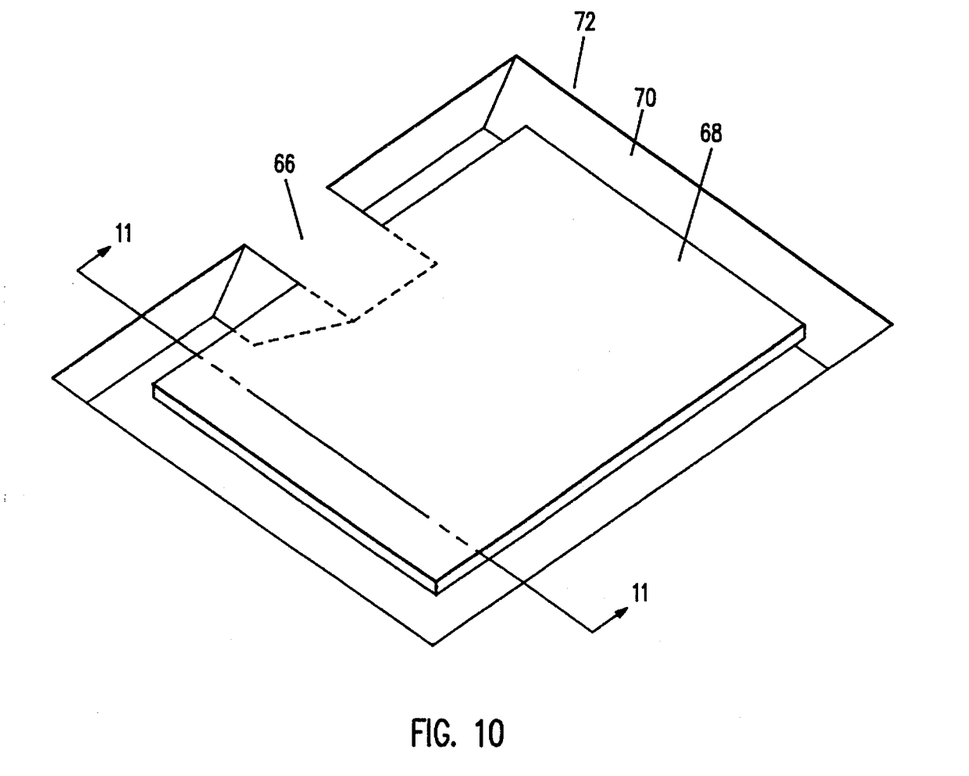
FIG. 10 is an isometric view illustrating another alternative embodiment of a semiconductor die having an isolation area formed therein in accordance with the present invention.
Figure 11:
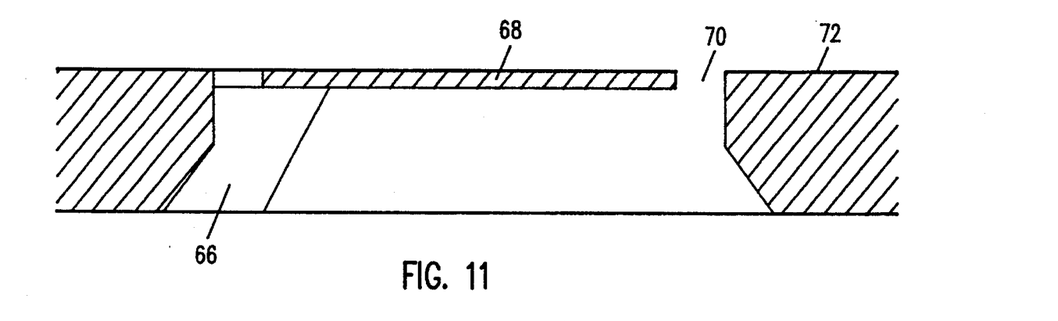
FIG. 11 is an enlarged cross-sectional view taken along line 11—11 of FIG. 10.

The thicknesses of the paddle member 26 is preferably less than the thickness of the die 20. Although FIG. 2 shows the thicknesses of the handle member 28 and the paddle member 26 being equal, it should be understood that the thickness of the handle member 28 may be increased in order to provide a more rigid support for the paddle member 26. Increasing the thickness of the handle member 28 will be discussed below in connection with FIGS. 10 and 11.

The greater the mass of the paddle member 26, the more that it will flex when forces are applied to it. Although the paddle member 26 should preferably be able to flex a small amount in order to reduce the effects of stress, it should not be so flexible that it is constantly moving or even vibrating. The purpose of the paddle member 26 is to isolate sensitive portions of circuitry from mechanical stress and thermal gradients. If the paddle member 26 is constantly moving or vibrating because it is too heavy and flexible, the paddle member 26 may not fulfill its purpose of reducing mechanical stresses in the sensitive circuitry. In order to minimize the flexibility of the paddle member 26, it should preferably have a small mass. As will be discussed below, the paddle member 26 is preferably formed from the same material as the die 20. Forming the paddle member 26 from the same material as the die 20 will give the paddle member 26 an ideal mass that will minimize its flexibility.

FIG. 2 illustrates a feature of the isolation area 22 that is omitted in FIG. 1. Specifically, the isolation area 22 includes a cap 34 that is bonded to the die 20. The cap 34 completely covers the hole 24, the paddle member 26, and the handle member 28. The cap 34 is spaced apart from the paddle member 26 so that the cap 34 does not make contact with the sensitive circuitry mounted on the paddle member 26.

Although the cap 34 is preferably formed from a layer of polysilicon, it should be understood that a variety of materials may be used to form the cap 34. For example, the cap 34 could be a mechanical cap such as a metal cap, a plastic cap, a cap formed from foil tape, or the like. The cap 34 could be a second semiconductor wafer that covers the paddle member 26, or the cap 34 could be formed from small etched metal cap arrays that are bonded to the die 20.

Because the thickness of the paddle member 26 is less than the thickness of the die 20, a cavity 35 is formed beneath the paddle member 26. The cavity 35 is enclosed because the die 20 is bonded to the lead frame 32. The presence of the cap 34 causes the paddle member 26 to be sealed in the enclosed space between the lead frame 32 and the cap 34. Because the paddle member 26 is enclosed completely within its own sealed cavity, it is isolated from thermal and mechanical stress. Normal vibration and g-forces are not sufficient to break the handle member 28 because of the small mass of the paddle member 26. Furthermore, stress caused by vibration or flexing of the handle member 28 should be confined to the handle member 28 where no stress sensitive elements are located.

Referring back to FIG. 1, a method of manufacturing an integrated semiconductor device having the isolation area 22 begins with obtaining a solid semiconductor die 20 having upper and lower flat surfaces. The stress and temperature sensitive circuit elements 36 that are to be isolated are collected together and mounted closely together on a preferably rectangular paddle area 26 of the die 20. The paddle area 26 will eventually become the paddle member 26. In positioning the sensitive circuit elements 36 and the paddle area 26, an unoccupied area 24, i.e., an area having no circuitry thereon, should be preserved between the paddle area 26 and the rest of the circuitry on the upper surface of the die 20. The unoccupied area 24 will eventually become the part of the hole 24 that is between the paddle member 26 and the die 20. Provision is made in the mask set to isolate the paddle area 26 by the unoccupied area 24.

The unoccupied area 24 should substantially surround the paddle area 26 except for a small section which defines a handle area 28. The handle area 28 will eventually become the handle member 28.

Figure 3:
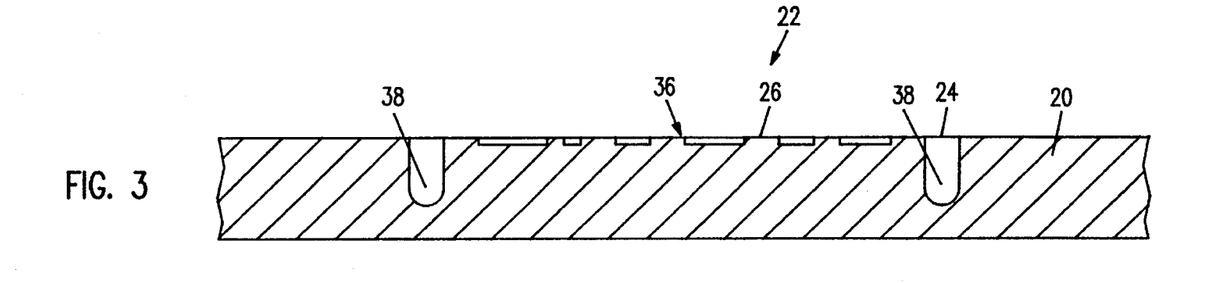

Referring to FIG. 3, a trench 38 (or channel) is formed in the unoccupied area 24. The trench 38 has a depth that is less than the thickness of the die 20. The trench 38 is interrupted at the handle area 28, i.e., the middle of one edge of the paddle area 26, to form the handle member 28 which will provide mechanical connection to the die 20.

Figure 4:
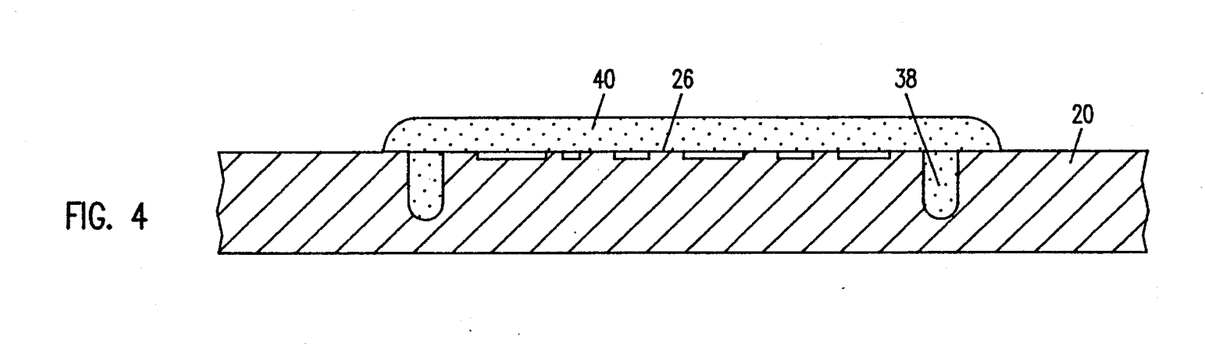

Up to this point the die 20 has been processed normally up to and including passivation. At this point, however, a thick sacrificial spacer material 40 is deposited on top of the passivation over the paddle area 26, the trench 38, and the handle area 28, as shown in FIG. 4. The sacrificial spacer material 40 is preferably a thick layer of oxide. After it is deposited, the sacrificial spacer material 40 is etched away except over the trench 38, the paddle area 26, and the handle area 28.

Figure 5:
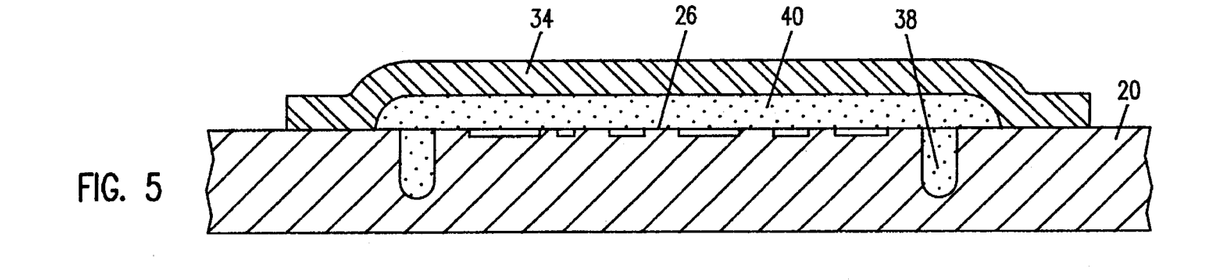

Referring to FIG. 5, a polysilicon layer is applied over the structure so that the cap 34 is formed over the sacrificial spacer material 40. The excess of the cap layer 34 is etched away except over the sacrificial spacer material 40.

Figure 6:
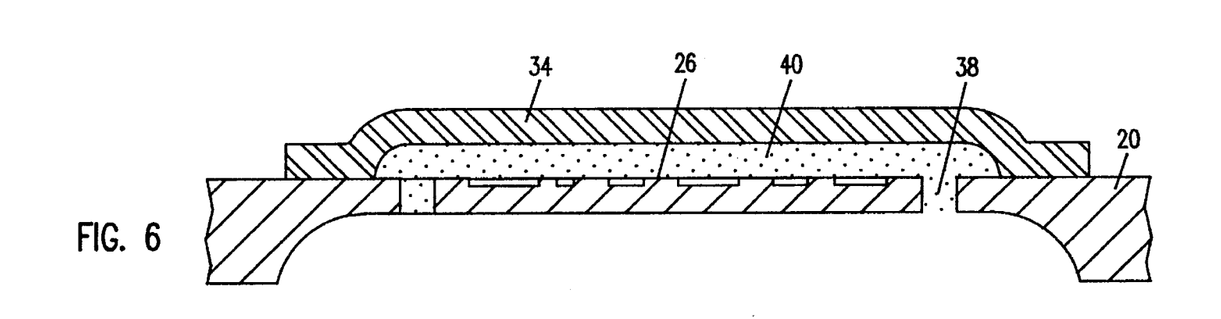

Referring to FIG. 6, the next step is to isolate the paddle member 26 by performing an anisotropic etch to the lower or back side of the die 20. The anisotropic etch is performed until the handle area 28 provides the only connection between the paddle area 26 and the rest of the die 20. The anisotropic etch causes the trench 38 to extend completely through the die 20 so that the hole 24 (FIG. 1) and the cavity 35 (FIG. 2) are formed. The resultant paddle member 26 is allowed to become very thin during the anisotropic etch for minimum inertia and sensitivity to vibration.

Figure 7:
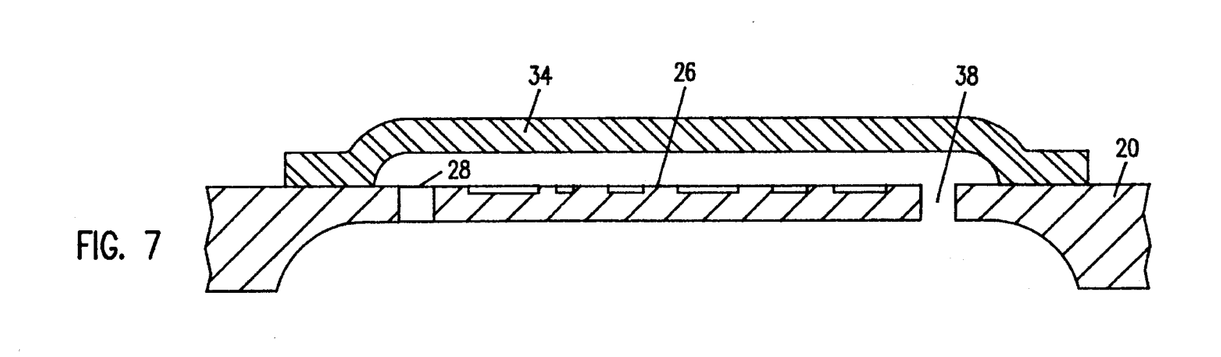

In order to render the paddle member 26 free of any mechanical contact, the sacrificial spacer material 40 between the paddle member 26 and the cap layer 34 may be etched out through the trench 38 (now the hole 24) as shown in FIG. 7. Although the performance of this step is preferred, it is optional and may not be necessary. Specifically, because the paddle member 26 is free to flex downward, the sacrificial spacer material 40 may not transfer stress to the paddle member 26. In other words, because the paddle member 26 can easily move down away from any pressure, there is nothing for such pressure to push against.

If the sacrificial spacer material 40 is etched away, it may be desirable at this point to insure that the etched cavity 35 is clean. The die 20 is then bonded to the lead frame 32, as shown in FIG. 2, so that the paddle member 26 is totally sealed between the polysilicon cap layer 34 and the lead frame 32. Die bonding techniques for back-etched die have long been available.

The paddle member 26 is mechanically and thermally isolated from the rest of the semiconductor die 20 except for the small handle member 28. The handle member 28 cannot transfer significant quantities of stress or thermal gradient to the paddle member 26 because of its small size. The sensitive circuitry 36 rests on the thin paddle member 26 isolated from the rest of the die 20 and from the packaging molding compound by the cap layer 34.

The expense of the extra fabrication steps involved in forming the isolation area 22 should be offset by the improved performance achieved without the need of expensive packaging techniques. The economies of batch processing should also help reduce costs.

Figure 8:
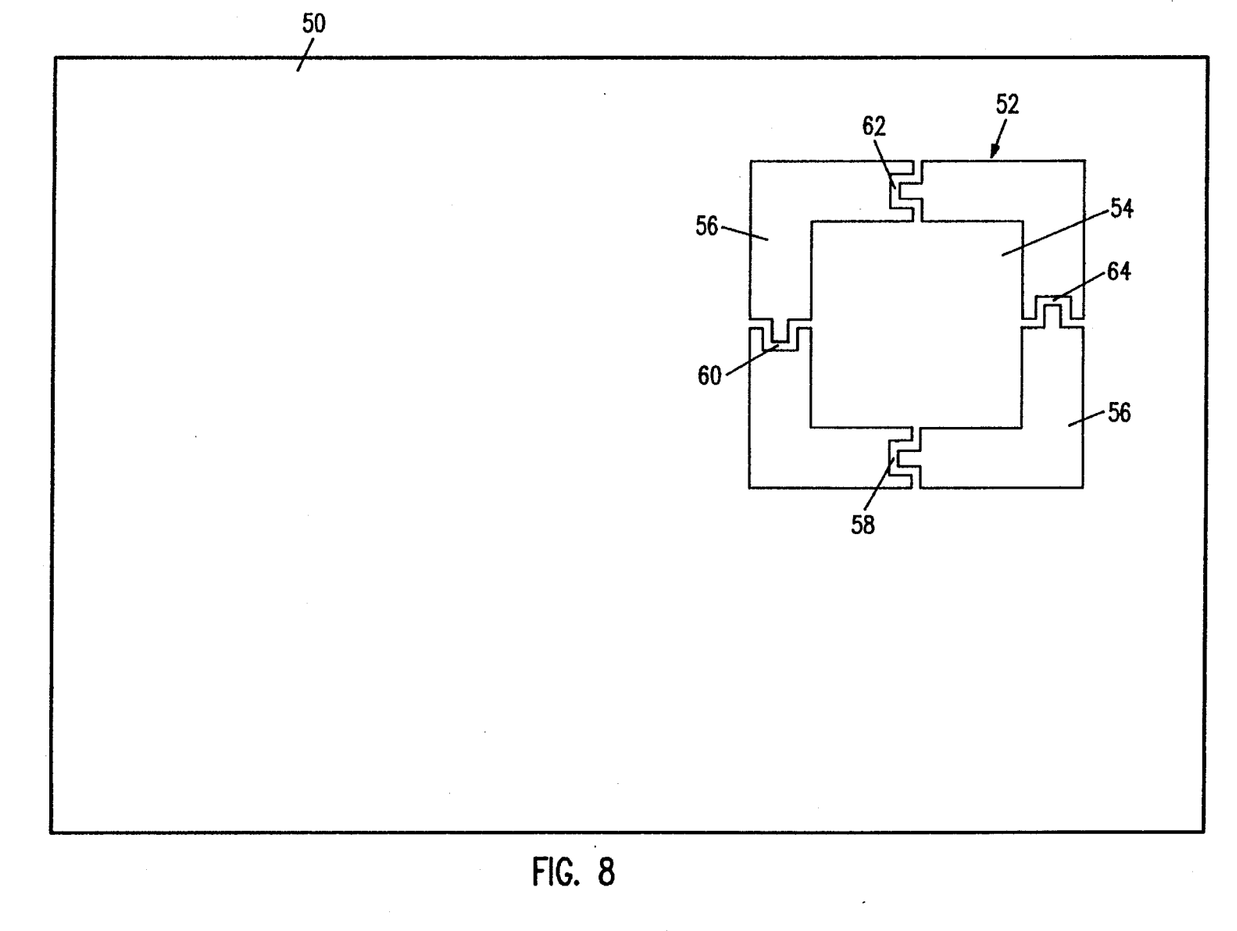
FIG. 8 is a top plan view illustrating an alternative embodiment of a semiconductor die having an isolation area formed therein in accordance with the present invention.

FIG. 8 illustrates an alternative embodiment of an integrated semiconductor die 50 in accordance with the present invention. An isolation area 52 includes a paddle member 54 that is positioned in a hole 56. The hole 56 extends completely through the die 50. Stress and temperature sensitive circuitry may be mounted on the paddle member 54.

The difference between the isolation area 52 and the isolation area 22 discussed above is that the isolation area 52 includes four handle members 58, 60, 62, and 64 instead of just one handle member 28. The four handle members 58, 60, 62, and 64 connect the paddle member 54 to the main part of the die 50. Rather than being straight in shape, the handle members 58, 60, 62, and 64 are preferably bent. The several angles in the handle members 58, 60, 62, and 64 created by their bent shape prevents stresses from pushing on each other which prevents stresses from building up in the handle members 58, 60, 62, and 64. Therefore, the bent shape of the handle members 58, 60, 62, and 64 helps to reduce the amount of stress that is transferred from the main part of the die 50 to the paddle member 54.

Figure 9:
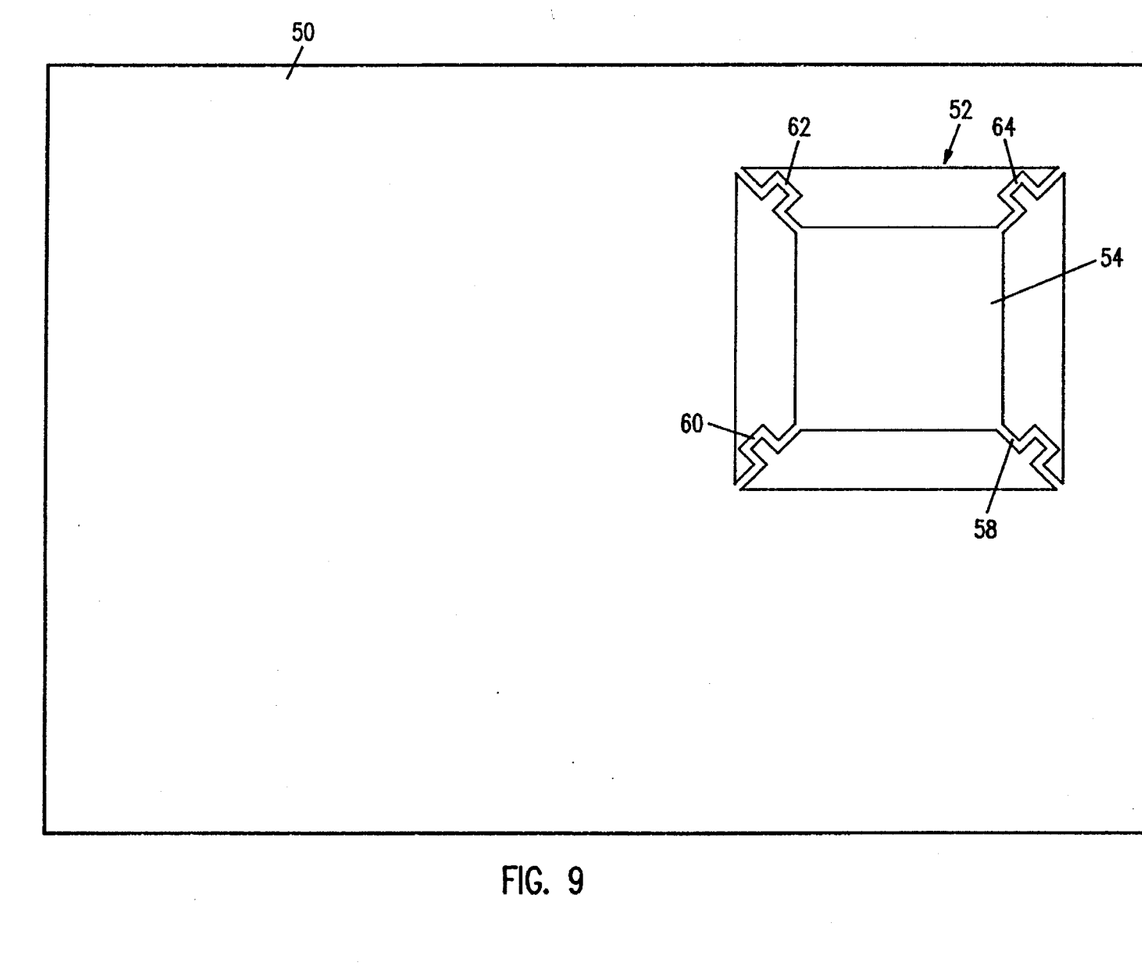
FIG. 9 is a top plan view illustrating another alternative embodiment of a semiconductor die having an isolation area formed therein in accordance with the present invention.

The use of four handle members 58, 60, 62, and 64 rather than just one increases the strength of the paddle member 54. Furthermore, the handle members 58, 60, 62, and 64 may be connected to the paddle member 54 in a variety of locations, such as, for example, along the sides of the paddle member 54 as shown in FIG. 8, or at the corners of the paddle member 54 as shown in FIG. 9. Although connecting the paddle member 54 to the die 50 at four points, i.e., the four handle members 58, 60, 62, and 64, rather than just one increases the strength of the paddle member 54, the thermal isolation of the paddle member 54 is slightly decreased due to the multiple connections. Specifically, the multiple connections provide more points for the transfer of thermal gradients to the paddle member 54. For example, if the handle member 64 is hot, then thermal gradients would be created between the handle members 64 and 60, the handle members 64 and 62, and the handle members 64 and 58. Therefore, increased strength in the paddle member 54 results in decreased thermal isolation.

The method used to form the isolation area 52 is substantially the same as described above. The only difference is that the trench 56, which eventually becomes the hole 56, is etched in a shape that accommodates for the bent handle members 58, 60, 62, and 64. Once the trench 56 is formed, a thick sacrificial spacer material and a polysilicon layer are applied over the trench 56, the paddle member 54, and the handle members 58, 60, 62, and 64, in the same manner as described above. The paddle member 54 is isolated by performing an anisotropic etch to the back side of the die 50, as described above. Metal lines may be mounted on one or more of the handle members 58, 60, 62, and 64 to provide electrical connection between the main part of the die 50 and the sensitive circuit elements on the paddle member 54.

Referring back to FIG. 1, another aspect of the present invention is that a heated substrate may be deposited on the paddle member 26 (or the paddle member 54 shown in FIG. 8). Heated substrates are sometimes used to heat circuitry that operates more efficiently at higher temperatures. Because the paddle member 26 is thermally isolated from the main part of the die 20, the heat generated by the heated substrate will remain on the paddle member 26 and be substantially prevented from dissipating into the main part of the die 20. The prevention of such dissipation will decrease the amount of power that the heated substrate requires to heat the paddle member 26 and prevent the rest of the die 20 from being heated by the heated substrate.

A handle member, such as the handle member 28 shown in FIG. 2, may be relatively thin, or, it may be some-what thick in order to provide a rigid support. For example, referring to FIGS. 10 and 11, a some-what thick handle member 66 suspends a paddle member 68 in an opening 70 in a semiconductor die 72. The handle member 66 has a vertical thickness that is approximately equal to the thickness of the die 72. The handle member 66 provides a more rigid support for the paddle member 68 than the support provided by the handle member 28 for the paddle member 26 (FIG. 2). It should be understood that the handle members 28 and 66 may be many different thicknesses, and, in general, the thicker the handle members 28 and 66, the more rigid the support provided to the paddle members 26 and 68.

Some examples of the possible applications of the present invention are: precision portions of system integrated circuits, integrated circuits in hostile temperature environments, precision integrated circuits in molded packages, military/aerospace integrated circuits, precision voltage references, and precision operational amplifiers.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An integrated semiconductor device, comprising:
   a semiconductor die having a first surface, a second surface, and a thickness, the semiconductor die being formed from a first material and having an opening formed in the first surface;
   a paddle member for isolating portions of circuitry from mechanical stress and thermal gradients, the paddle member being formed from the first material and having a first surface, a second surface, and a thickness that is less than the thickness of the semiconductor die;
   a handle member connected between the paddle member and the semiconductor die to suspend the paddle member in the opening, the handle member being formed from the first material and having a thickness which permits it to flex so that the paddle member can move with respect to the semiconductor die; and
   a cap bonded to the first surface of the semiconductor die to completely cover the opening, the paddle member, and the handle member, all portions of the cap being spaced apart from all portions of the paddle member so that the cap does not make contact with the paddle member and to provide a cavity between the cap and the paddle member so that the paddle member can move within the cavity free of any mechanical contact with any part of the cap.

2. An integrated semiconductor device in accordance with claim 1, wherein:
   the paddle member has circuitry mounted thereon; and
   the handle member provides a path for making electrical connection between the paddle member and the semiconductor die.

3. An integrated semiconductor device in accordance with claim 1, wherein:
   the opening in the semiconductor die is substantially rectangular in shape; and
   the paddle member is substantially rectangular in shape.

4. An integrated semiconductor device in accordance with claim 1, wherein the paddle member first surface is substantially parallel with the semiconductor die first surface.

5. An integrated semiconductor device in accordance with claim 1, wherein the cap comprises a layer of polysilicon.

6. An integrated semiconductor device in accordance with claim 1, further comprising at least one additional handle member connected between the paddle member and the semiconductor die for supporting the paddle member in the opening.

7. An integrated semiconductor device in accordance with claim 1, wherein the handle member includes a plurality of angles formed therein.

8. An integrated semiconductor device in accordance with claim 1, further comprising:
   a heated substrate deposited on the paddle member.

9. An integrated semiconductor device in accordance with claim 1, further comprising:
   a lead frame, the second surface of the semiconductor die being bonded to the lead frame.

10. An integrated semiconductor device, comprising:
    a semiconductor die having a first surface, a second surface, and a thickness, the semiconductor die being formed from a first material and having a hole that extends from the first surface through the semiconductor die to the second surface;
    a paddle member formed from the first material and having a first surface, a second surface, and a thickness that is less than the thickness of the semiconductor die;
    a handle member connected between the paddle member and the semiconductor die to suspend the paddle member in the hole, the handle member being formed from the first material and having a thickness which permits it to flex so that the paddle member can move with respect to the semiconductor die;
    a cap bonded to the first surface of the semiconductor die to completely cover the hole, the paddle member, and the handle member, all portions of the cap being spaced apart from all portions of the paddle member so that the cap does not make contact with the paddle member and to provide a cavity between the cap and the paddle member so that the paddle member can move within the cavity free of any mechanical contact with any part of the cap; and
    a lead frame, the second surface of the semiconductor die being bonded to the lead frame.

11. An integrated semiconductor device in accordance with claim 10, wherein:
    the paddle member has circuitry mounted thereon; and
    the handle member provides a path for making electrical connection between the paddle member and the semiconductor die.

12. An integrated semiconductor device in accordance with claim 10, wherein:
    the hole in the semiconductor die is substantially rectangular in shape; and
    the paddle member is substantially rectangular in shape.

13. An integrated semiconductor device in accordance with claim 10, wherein the paddle member first surface is substantially parallel with the semiconductor die first surface.

14. An integrated semiconductor device in accordance with claim 10, wherein the cap comprises a layer of polysilicon.

15. An integrated semiconductor device in accordance with claim 10, further comprising at least one additional handle member for connecting the paddle member to the semiconductor die.

16. An integrated semiconductor device in accordance with claim 15, wherein the handle members each have a plurality of angles formed therein.

17. An integrated semiconductor device in accordance with claim 10, further comprising:
    a heated substrate deposited on the paddle member.

* * * * *